United States Patent [19]

Matsumura et al.

[11] Patent Number: 5,253,213
[45] Date of Patent: Oct. 12, 1993

[54] SEMICONDUCTOR MEMORY USED FOR CHANGING SEQUENCE OF DATA

[75] Inventors: Tetsuya Matsumura; Shinichi Uramoto, both of Hyogo, Japan

[73] Assignee: Mitsubishi Denki Kabushiki Kaisha, Tokyo, Japan

[21] Appl. No.: 768,042

[22] Filed: Oct. 1, 1991

[30] Foreign Application Priority Data

Oct. 9, 1990 [JP] Japan ................... 2-272728

[51] Int. Cl.$^5$ .................. G11C 8/00; G11C 13/00
[52] U.S. Cl. .................. 365/230.09; 365/239; 365/240; 365/230.06
[58] Field of Search .............. 365/239, 230.09, 240, 365/230.06

[56] References Cited

U.S. PATENT DOCUMENTS

| | | |
|---|---|---|
| 3,934,094 | 1/1976 | Kobayashi et al. |
| 4,120,048 | 10/1978 | Fuhrman .................. 365/230.09 |
| 4,779,233 | 10/1988 | Foran, Jr. ................. 365/230.09 |
| 4,845,678 | 7/1989 | Van Berkel et al. ......... 365/230.09 |
| 4,873,671 | 10/1989 | Kowshik et al. ............ 365/230.09 |
| 4,903,242 | 2/1990 | Hamaguchi et al. ......... 365/230.08 |

FOREIGN PATENT DOCUMENTS 2343158 8/1972 Fed. Rep. of Germany .
60-193190 10/1985 Japan .

OTHER PUBLICATIONS

Hannaford, "Sequentially addressed storage", IBM TDB, vol. 20, No. 2, Jul. 1977, pp. 732-733.
"The Fast Fourier Transform (FFT)", E. Oran Brigham, Prentice-Hall, Inc., pp. 148-163.
"Principles of CMOS VLSI Design, A Systems Perspective", Weste et al., Addison-Wesley Publishing Company pp. 348-349.

Primary Examiner—Eugene R. LaRoche
Assistant Examiner—Viet Q. Nguyen
Attorney, Agent, or Firm—Lowe, Price, LeBlanc & Becker

[57] ABSTRACT

An SRAM adapted for changing the sequence of data. A counter 7 generates a sequentially increasing address signal. A write designation circuit 2a sequentially designates a memory cell row to be selected for writing in response to the address signal. Conversely, a read designation circuit 3a designates a memory cell row in response to the address signal in a sequence determined by a predetermined rule. The generation of an address signal, which changes in a complicated manner and is required for changing the sequence of data, is not required, so that the amount of the operation process by the CPU is decreased.

15 Claims, 13 Drawing Sheets $r = p \cdot k_1 + q \cdot k_2$

FIG. 6A
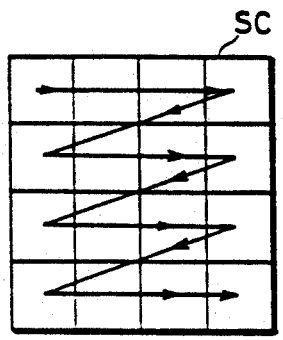
FIG. 6B
| p0 | p1 | p2 | p3 |
|----|----|----|----|
| p4 | p5 | p6 | p7 |
| p8 | p9 | p10 | p11 |
| p12 | p13 | p14 | p15 |
SC
FIG 6C
| p3 | p7 | p11 | p15 |
|----|----|----|----|
| p2 | p6 | p10 | p14 |
| p1 | p5 | p9 | p13 |
| p0 | p4 | p8 | p12 |
SC
FIG. 7
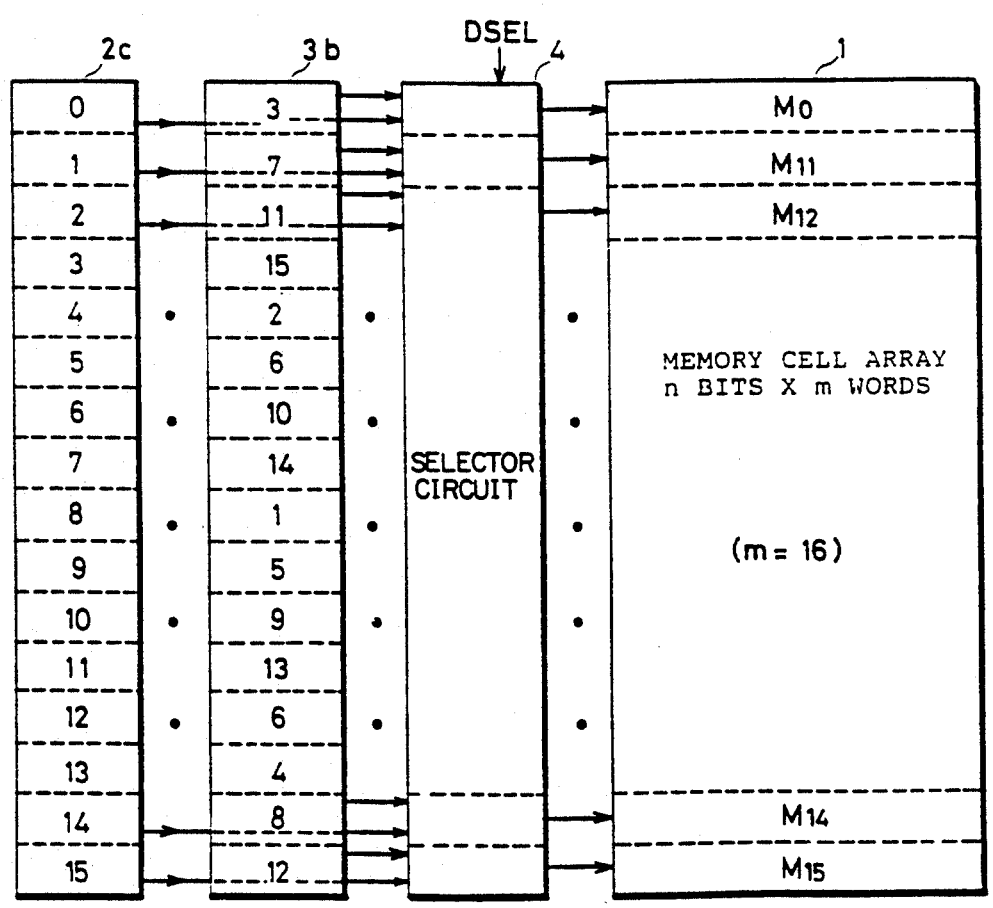

SEMICONDUCTOR MEMORY USED FOR CHANGING SEQUENCE OF DATA

BACKGROUND OF THE INVENTION

1. Field of the Invention

The invention relates generally to semiconductor memories, and more particularly, to a semiconductor memory applied for changing sequence of data in accordance with a predetermined rule. The invention has particular applicability to microprocessors for executing Fast Fourier Transform (FFT) or an arrangement conversion in picture processing.

2. Description of the Background Art

In general, in data processing, a change of the sequence of a plurality of data is often required. For example, in order to effect data processing for Fast Fourier Transform (hereinafter referred to as FFT), the sequence of a plurality of data is changed. In this case, once the plurality of data are stored in a data array, the data stored are supplied from the data array in accordance with a sequence required in FFT. A detailed description as to the operation for FFT may be found, for example, in a text entitled "THE FAST FOURIER TRANSFORM" by E. ORAN BRIGHAM (Drentice-Hall Inc.).

When an operation is carried out for FFT by a microprocessor, the operation for FFT is executed in accordance with a program stored in a memory of the microprocessor. That is, the CPU carries out the process for changing the sequence of data required in FFT in accordance with a stored program. This causes increase of the amount of the operation to be processed by the CPU. Accordingly, the time required for the operation process by the CPU is increased. Particularly, in the operation process for FFT, a change of the sequence of the data to be processed is often required, so that the burden of the CPU is increased.

In addition to the conversion of the data sequence for the above-mentioned FFT, the conversion of the data sequence as well is often required in the field of image processing. For example, in an arrangement conversion in image processing, that is, in the case where an image is turned 90°, the conversion of the data sequence is required. In general, in image processing, high-speed data processing is required, so that the amount of the operation of the CPU should also be decreased in this case. Accordingly, a decrease in the amount of the operation of the CPU contributes to the high-speed data processing.

FIG. 8 is a block diagram of a conventional static random access memory (hereinafter referred to as SRAM) provided in a microprocessor Referring to FIG. 8, this SRAM 95 comprises a memory cell array 1 including memory cells disposed in m rows and n columns (not shown), a decoder 8 for designating a memory cell row, an input circuit 5 for writing input data (parallel data having n bits) DI supplied to the designated memory cell row, and an output circuit 6 for reading the stored data from the designated memory cell row. One data which may be written in the memory cell array 1 includes n bits (for example, 8, 16, 32 bits and so on). A total of m data may be stored in this memory cell array 1. That is, this memory cell array 1 has a storage capacity of n bits×m words. In order to make the description simple, a description will be made as to a case of m=16 in the following.

In write operation, the decoder 8 receives an address signal AD generated from an address generation circuit in the microprocessor. The decoder 8 designates one of 16 memory cell rows M0 to M15 in response to the address signal AD. The input circuit 5 receives the input data DI generated from the arithmetic unit in the microprocessor. The input circuit 5 drives a bit line (not shown) in response to a write enable signal WE generated from the controller in the microprocessor. That is, the bit line is driven based on the input data DI applied. As a result, the input data DI is written in the designated memory cell row.

In read operation, after the decoder 8 designates a memory cell row, the output circuit 6 including a sense amplifier (not shown) is activated in response to a sense enable signal SE. The signal SE is generated from the controller in the microprocessor. Accordingly, the data stored in the designated memory cell row is amplified by the output circuit 6, and the amplified signal is generated as output data (parallel data having 8 bits) DO. The output data DO is sent to the arithmetic unit.

FIG. 9 shows an example of a circuit diagram of the input circuit 5, the output circuit 6, and one memory cell row shown in FIG. 8. Referring to FIG. 9, the input circuit 5 includes bit line activating circuits 51 to 5n for driving respectively n pairs of bit lines BL, $\overline{BL}$. Each bit line activating circuit 51 to 5n drives a bit line pair BL, $\overline{BL}$ simultaneously in response to the write enable signal WE. One memory cell row provided in the memory cell array 1 includes n SRAM memory cells MC1 to MCn connected to word lines WL. The word lines WL are connected to the decoder 8 shown in FIG. 8. The output circuit 6 includes n sense amplifiers 61 to 6n respectively connected to each bit line pair BL, $\overline{BL}$. Each sense amplifier 61 to 6n is activated simultaneously in response to the sense enable signal SE.

FIG. 10 shows another example of a conventional SRAM provided within a microprocessor. While SRAM 95 shown in FIG. 8 included decoder 8 for selecting a row only, SRAM 96 shown in FIG. 10 includes a column decoder (C.D.) 8b for column selection in addition to a row decoder 8a for row selection. Column decoder 8b generates a column select signal for controlling a selector circuit 9a in response to a column address signal supplied from an address generation circuit. Selector circuit 9a selects a column to be accessed in response to the applied column select signal.

When the SRAM shown in FIG. 8 is used for changing the above-mentioned data sequence, it is impossible to avoid the increase in the amount of the operation to be processed by the CPU. That is, in order to effect a changing process of data sequence, it is necessary to make different the sequence for designation of a memory cell row in which data is to be written and the sequence for designation of a memory cell row from which data is to be read, in accordance with a predetermined rule. For example, in order to carry out bit reverse addressing for FFT, at first, a write address signal is generated from the address generation circuit, and the input data DI is written in the memory cell row designated by the write address signal. A read address signal is then generated from the address generation circuit in accordance with a rule required in FFT. Accordingly, the stored data is sequentially read from the designated memory cell row. The sequence of the data read is different from the sequence of the applied input data. That is, the sequence of the data read is in accordance with the sequence required in FFT.

In this way, it is pointed out that the amount of the operation to be processed by the CPU is increased in order to generate a write and a read address signals while the address generation circuit generates a write address signal and a read address signal. The CPU causes a write and a read address signals to be generated by operation in accordance with a program stored in the microprocessor. Such an operation is executed in a data arithmetic unit or an address arithmetic unit within the CPU. The amount of the operation processed by the microprocessor is increased, so that the operation speed of the microprocessor is reduced.

SUMMARY OF THE INVENTION

One object of the invention is to simplify addressing required for controlling the sequence of data written in a memory cell array and the sequence of data read therefrom.

Another object of the invention is to decrease the amount of the operation to be processed by a microprocessor for addressing.

Still another object of the invention is to increase the operation speed of a microprocessor in addressing.

Still another object of the invention is to increase the operation speed in a microprocessor for FFT.

Yet another object of the invention is to increase the operation speed in a microprocessor for an arrangement conversion in image processing.

Yet another object is to simplify the control for changing the sequence of data written in data holding circuitry and the sequence of data read therefrom in data sequence converting circuitry.

In short, a semiconductor memory device according to the present invention includes an array of memory cells arranged in a matrix of row and columns and identified by row address and column address; address input circuit for successively generating addresses of the memory cells to be accessed; first designation circuit for designating a first sequence of accessing memory cells of the array in response to addresses generated by the address input circuit; and second designation circuit for designating a second sequence of accessing memory cells of the array in response to the addresses generated by the address input circuit. The first sequence and the second sequence have a predetermined relationship.

In operation, as the first and second designation circuits designate a sequence of accessing memory cells in accordance with a predetermined relationship, it is not necessary to perform an addressing operation in the outside of the device in order to control the sequence of data.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 6A to 6C are conceptual diagrams for explaining an arrangement conversion in image processing.

FIG. 7 is a circuit block diagram of a read designation circuit applied for an arrangement conversion in image processing.

DESCRIPTION OF THE PREFERRED EMBODIMENTS

Figure 2:
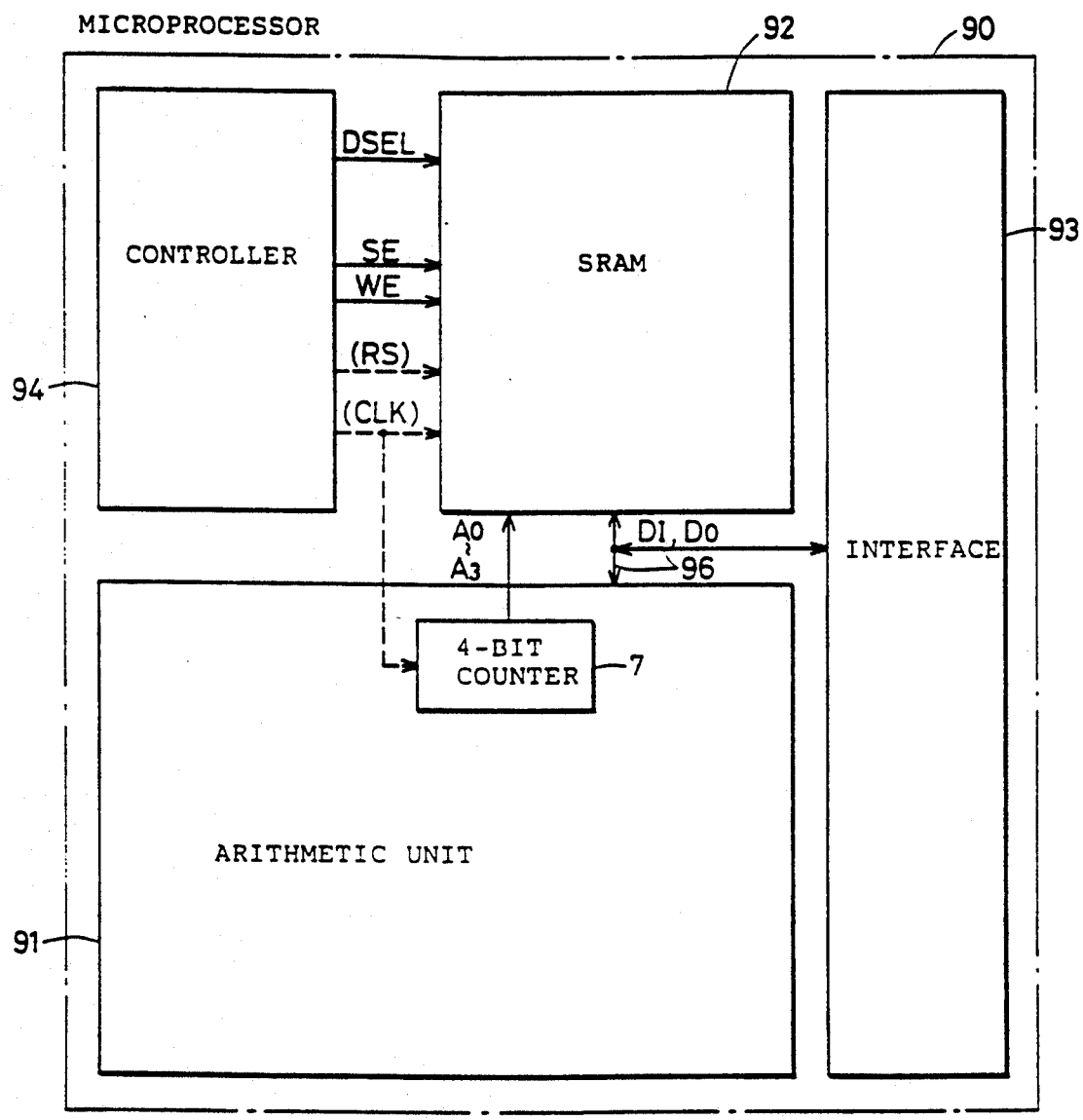
FIG. 2 is a block diagram of a microprocessor having the SRAM shown in FIG. 1.

Referring to FIG. 2, this microprocessor 90 comprises an arithmetic unit 91 for effecting operation process, an SRAM portion 92 including an SRAM in accordance with the invention, an interface 93 for effecting input and output of data and a control signal with an external device, and a controller 94 for generating a variety of control signals DSEL, SE and WE. The arithmetic unit 91 includes a 4-bit counter 7 for generating address signals of 4 bits A0 to A3 which are sequentially increased. The arithmetic unit 91, the SRAM 92 and the interface 93 are connected over a data bus 96. The input data DI and the output data DO are transmitted over the data bus 96.

Figure 1:
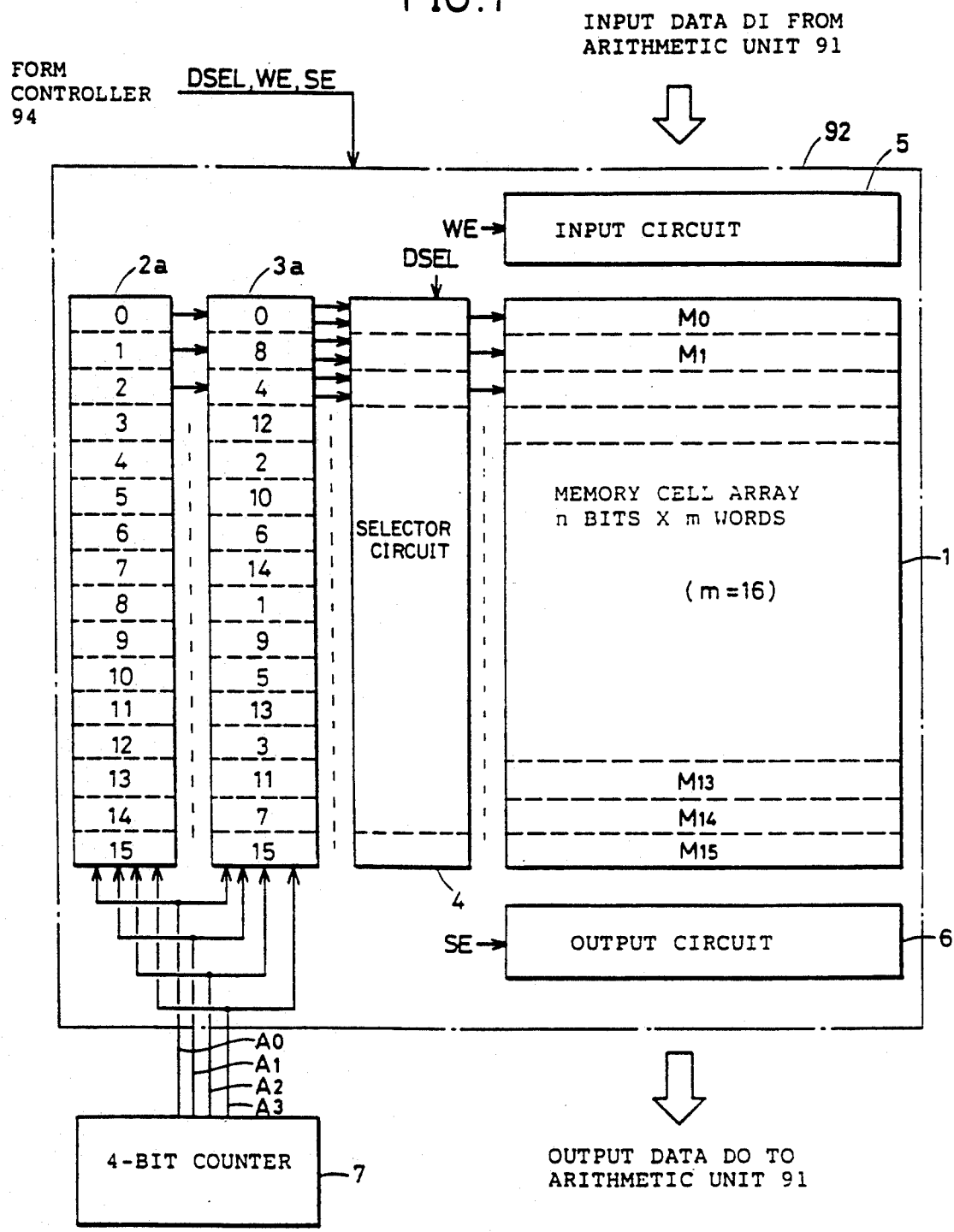
FIG. 1 is a circuit block diagram of an SRAM illustrating one embodiment of the invention.

FIG. 1 is a block diagram of the SRAM 92 shown in FIG. 2. Referring to FIG. 1, the SRAM 92 includes a memory cell array 1 having a memory capacity of n bits×m words, a write designation circuit 2a for designating a memory cell row in which data is to be written, a read designation circuit 3a for designating a memory cell row from which data is to be read, a selector circuit 4 for selecting either write designation or read designation, an input circuit 5 for writing an applied input data DI in the memory cell array 1, and an output circuit 6 for reading the data stored in the memory cell array 1. The write designation circuit 2a and the read designation circuit 3a are connected to receive address signals of 4 bits A0 to A3 generated from the 4-bit counter 7 provided in the arithmetic unit 91 shown in FIG. 2. In addition to this, this SRAM 92 is connected to receive control signals DSEL, WE and SE generated from the controller 94 shown in FIG. 2. The data DI, the sequence of which should be controlled (or changed), is applied from the arithmetic unit 91 shown in FIG. 2. The data, the sequence of which is controlled by this SRAM 92, i.e., the output data DO read over the output circuit 6, is returned to the arithmetic unit 91.

Figure 3:
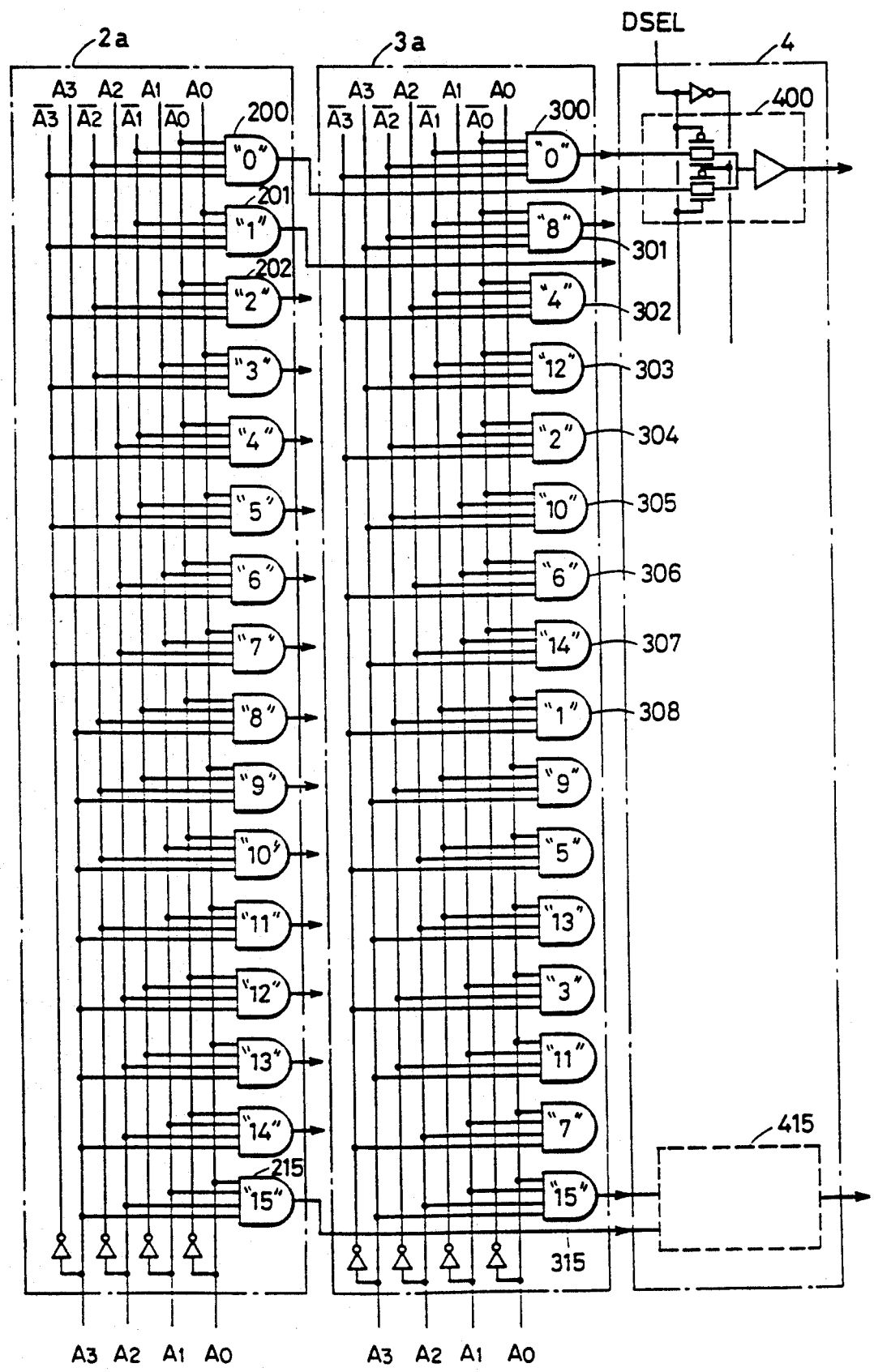
FIG. 3 is a circuit diagram of the write designation circuit and the read designation circuit shown in FIG. 1.

FIG. 3 is a circuit diagram of the write designation circuit 2a, the read designation circuit 3a and the selector circuit 4 shown in FIG. 1. Referring to FIG. 3, the write designation circuit 2a includes 16 AND gates 200 to 215 each having 4 inputs. The write designation circuit 2a receives the address signals A0 to A3 generated from the 4-bit counter 7 shown in FIG. 1. The address signals A0 to A3 inverted by the 4 inverters are generated. Each AND gate 200 to 215 is connected to receive either a non-inverted address bit or an inverted address bit of 4-bit address signal. As a result, in the example shown in FIG. 3, the AND gates 200 to 215 sequentially generate a signal at a high level respectively in response to the applied address signals A0 to A3, so that memory cell rows in which data is to be written are sequentially selected. The numbers "0", "1", ... "15" respectively given to each AND gate 200 to 215 indicate data represented by 4 bit address signals A0 to A3. When the data is applied, a corresponding memory cell row is selected. In the write designation circuit 2a, the memory cell rows M0 to M15 shown in FIG. 1 are sequentially designated in response to the address signals A0 to A3 which are sequentially increasing. As a result, the input data DI applied to the input circuit 5 is sequentially written in the memory cell rows M0 to M15 in write operation.

The read designation circuit 3a also includes AND gates 300 to 315 each having 4 inputs. Each AND gate 300 to 315 is also connected to receive either a non-inverted address bit or an inverted address bit. However, connection nodes of the non-inverted address lines A0 to A3 and the inverted address lines A0 to A3, and each AND gate 300 to 315 are different from those in the write designation circuit 2a. A connection node in the read designation circuit 3a is determined in accordance with the conversion of the sequence of data required in FFT. That is, the AND gate 300 generates a signal at a high level in response to data "0" represented by the applied address signals A0 to A3. That is, the memory cell row M0 is selected. When the address signals A0 to A3 representing data "2" are supplied, only the AND gate 304 generates a signal at a high level. Accordingly, the memory cell row M4 is selected. The sequentially increasing address signals A0 to A3 are thus supplied. The sequence of the memory cell rows selected by the read designation circuit 3a is in accordance with the sequence required in FFT. That is, the read designation circuit 3a may select the memory cell rows M0 to M15 in accordance with the sequence required in FFT in response to the supplied address signals A0 to A3.

The selector circuit 4 selects the output of either the write designation circuit 2a or the read designation circuit 3a in response to the selection signal DSEL generated from the controller 94. For example, the switching circuit 400 selectively supplies either one of the outputs of the AND gate 200 or the AND gate 300 in response to the selection signal DSEL. The selector circuit 4 includes a total of 16 switching circuits 400 to 415 having the same circuit structures as those of the switching circuit 400.

Figure 4:
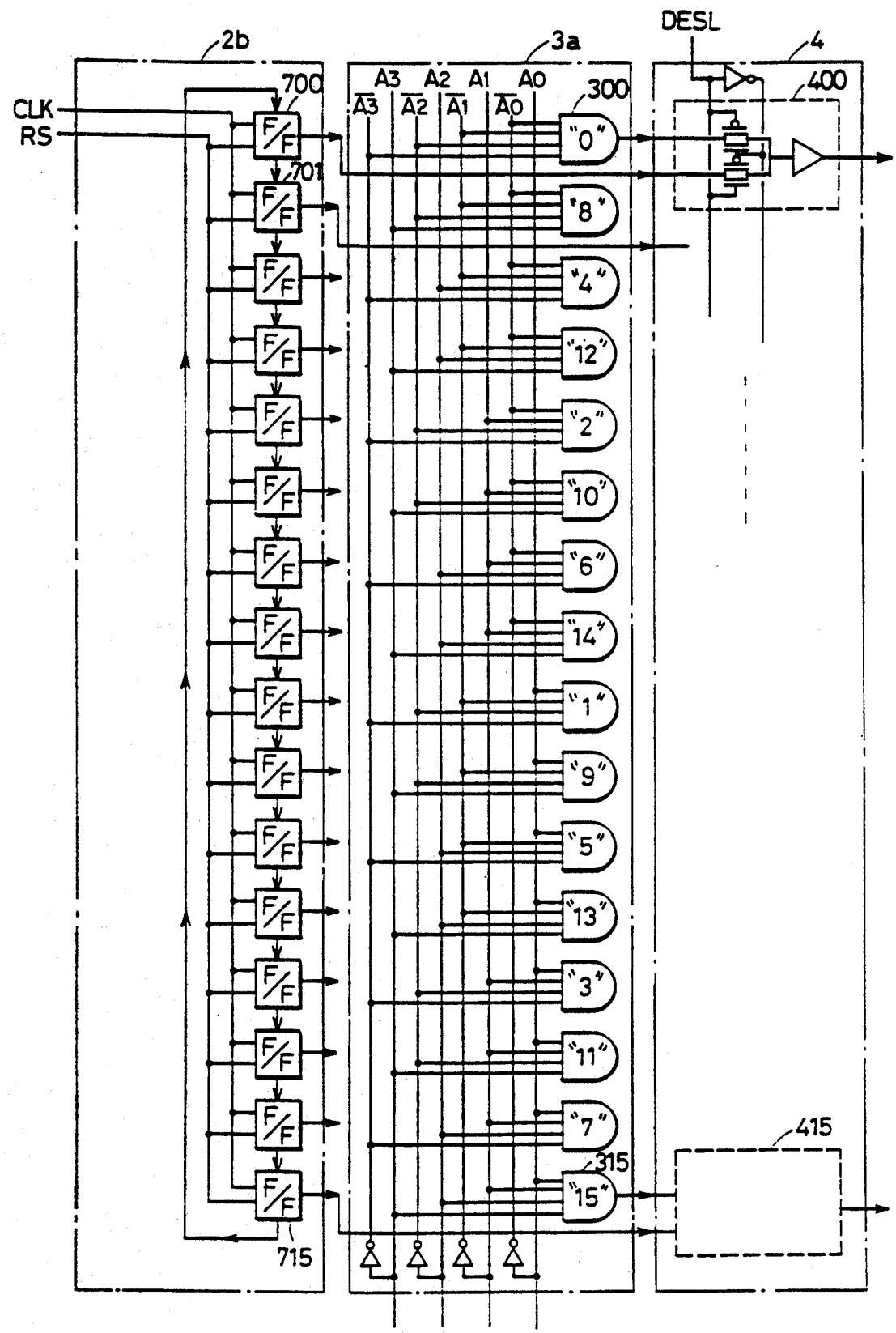
FIG. 4 is a circuit diagram illustrating another example of the write designation circuit shown in FIG. 1.

In place of the write designation circuit 2a shown in FIG. 3, the write designation circuit 2b as shown in FIG. 4 may be applied. The write designation circuit 2b shown in FIG. 4 comprises a ring pointer circuit including a cascade connection of 16 flipflops (F/F) 700 to 715. Each flipflop 700 to 715 is connected to receive a clock signal CLK and a reset signal RS generated from the controller 94 shown in FIG. 2.

In operation, the ring pointer circuit is reset in response to the reset signal RS, and then sequentially generates signals at a high level in response to the clock signal CLK. That is, the flipflops 700 to 715 sequentially generate signals at a high level in response to the clock signal CLK. Accordingly, the memory cell rows M0 to M15 shown in FIG. 1 may be sequentially selected. It is noted that the write designation circuit 2b shown in FIG. 4 has the same function as that of the write designation circuit 2a shown in FIG. 3.

Figure 5A:
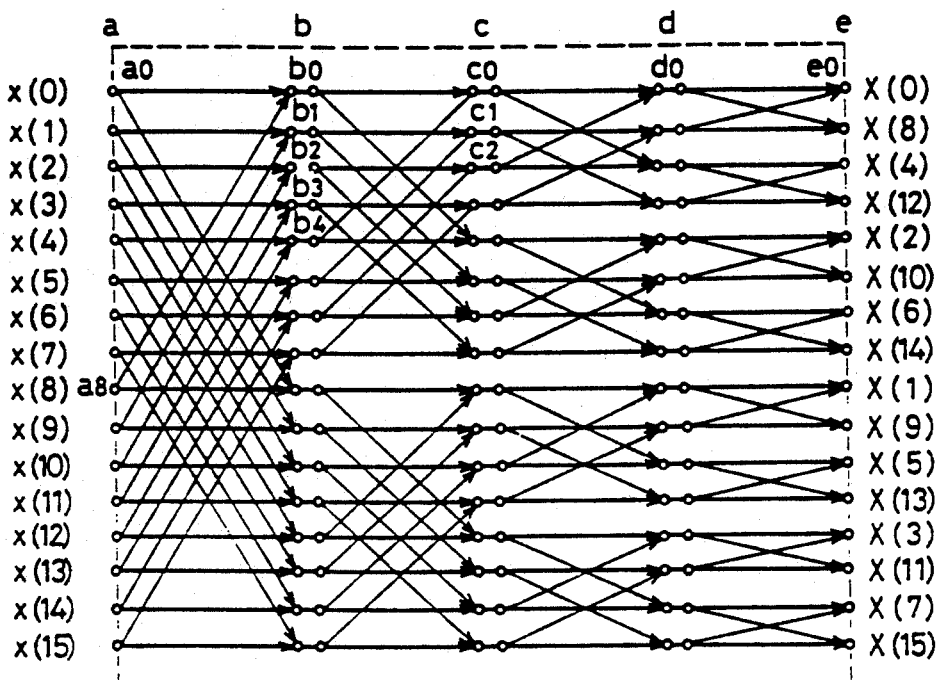
FIG. 5A is a flow diagram of a signal required in FFT.

Referring to FIG. 5A, the conversion of the sequence of data required in FFT, i.e., bit reverse addressing will be briefly described in the following. Data X (0) to X (15) whose data sequence should be converted are converted to the sequence required in FFT by way of a signal processing flow for FFT as shown in FIG. 5A. The data X (0) to X (15) whose data sequence has been changed may be obtained as output data DO. The details as to the signal processing as shown in FIG. 5 are described in the above-mentioned textbook by E. O. BRIGHAM. It is noted that the read designation circuit 3a shown in FIGS. 3 and 4 is preferable in converting the sequence of data required in the signal processing as shown in FIG. 5A.

The algorithm of the FFT shown in FIG. 5A is, in short, as follows. In the following description, data x(0) to x(15) are represented by a0 to a15 and data X(0) to X(15) are represented by e0 to e15, respectively. k1, k2, k3 and k4 represent prime numbers.

For example, data b0 and c0 are represented by the following equations:

$$b0 = a0 \cdot k1 + a8 \cdot k2 \quad (1)$$

$$c0 = b0 \cdot k3 + b4 \cdot k4 \quad (2).$$

Figure 5B:
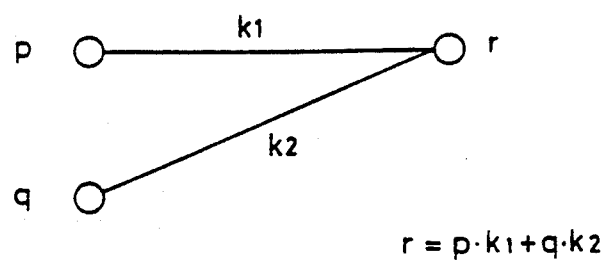
FIG. 5B is a signal flow diagram for describing a general rule in a FFT.
Figure 8:
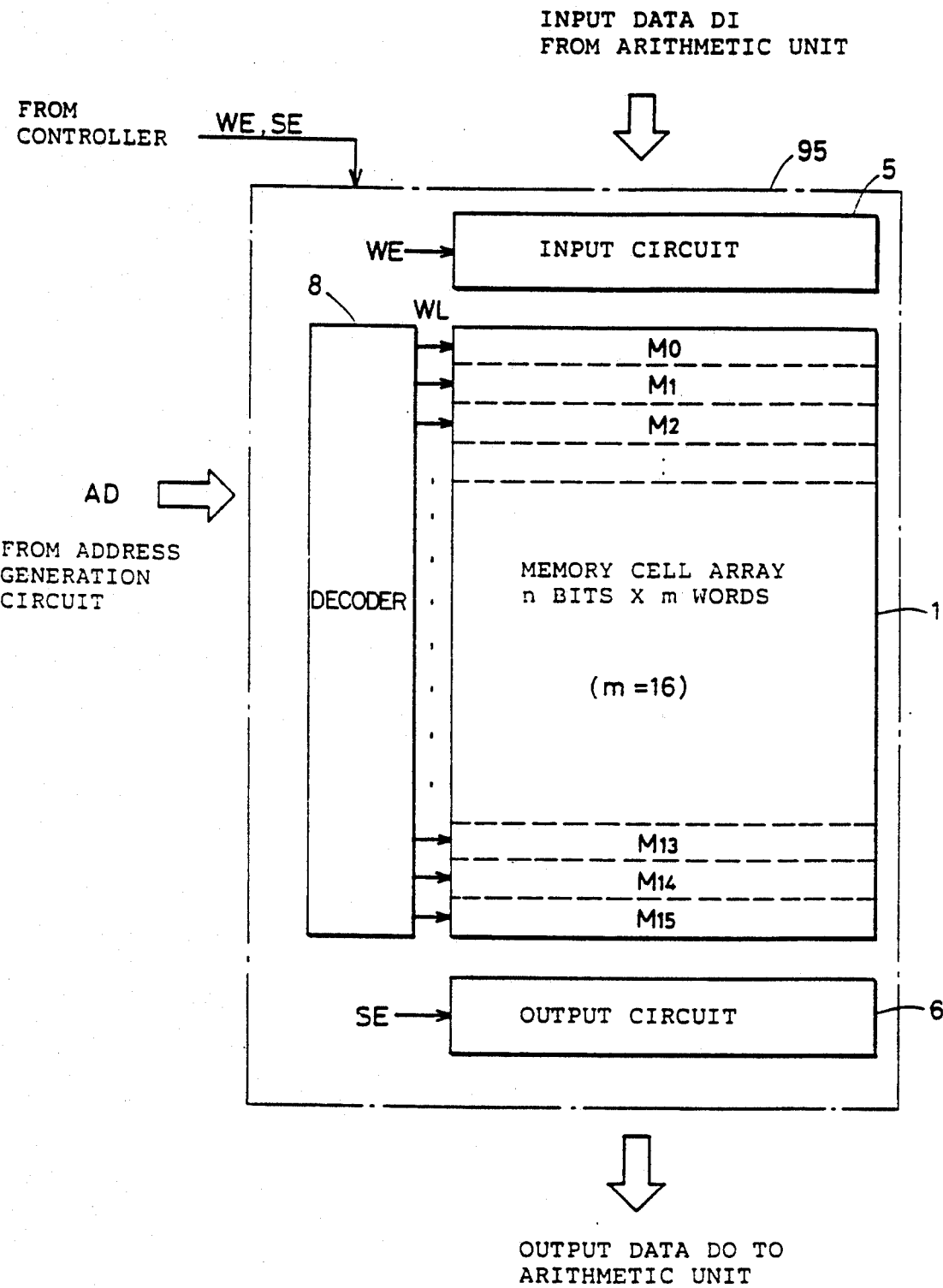
FIG. 8 is a circuit block diagram of a conventional SRAM.
Figure 9:
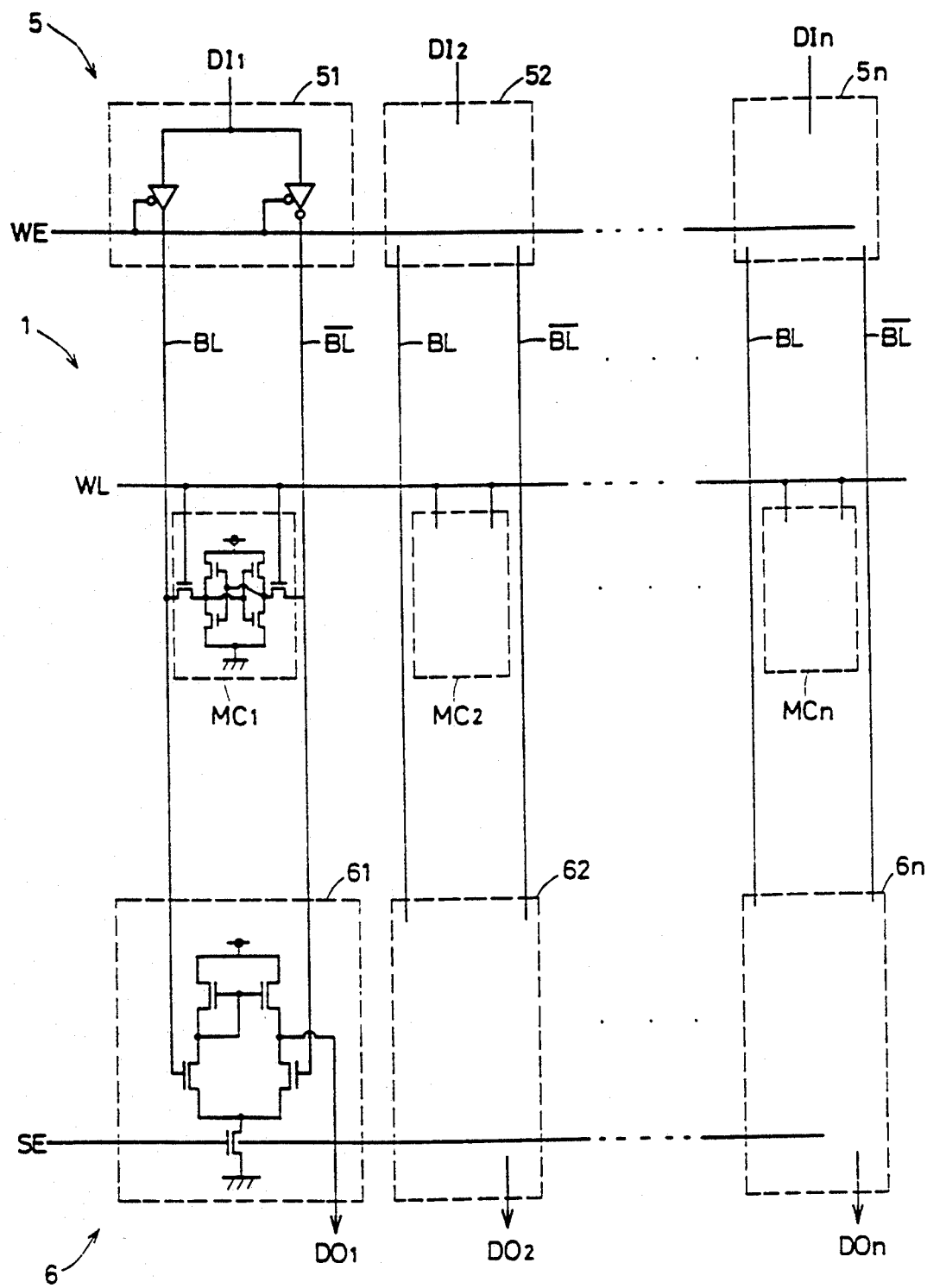
FIG. 9 is a circuit diagram of the input circuit, the output circuit and one memory cell row shown in FIG. 8.
Figure 10:
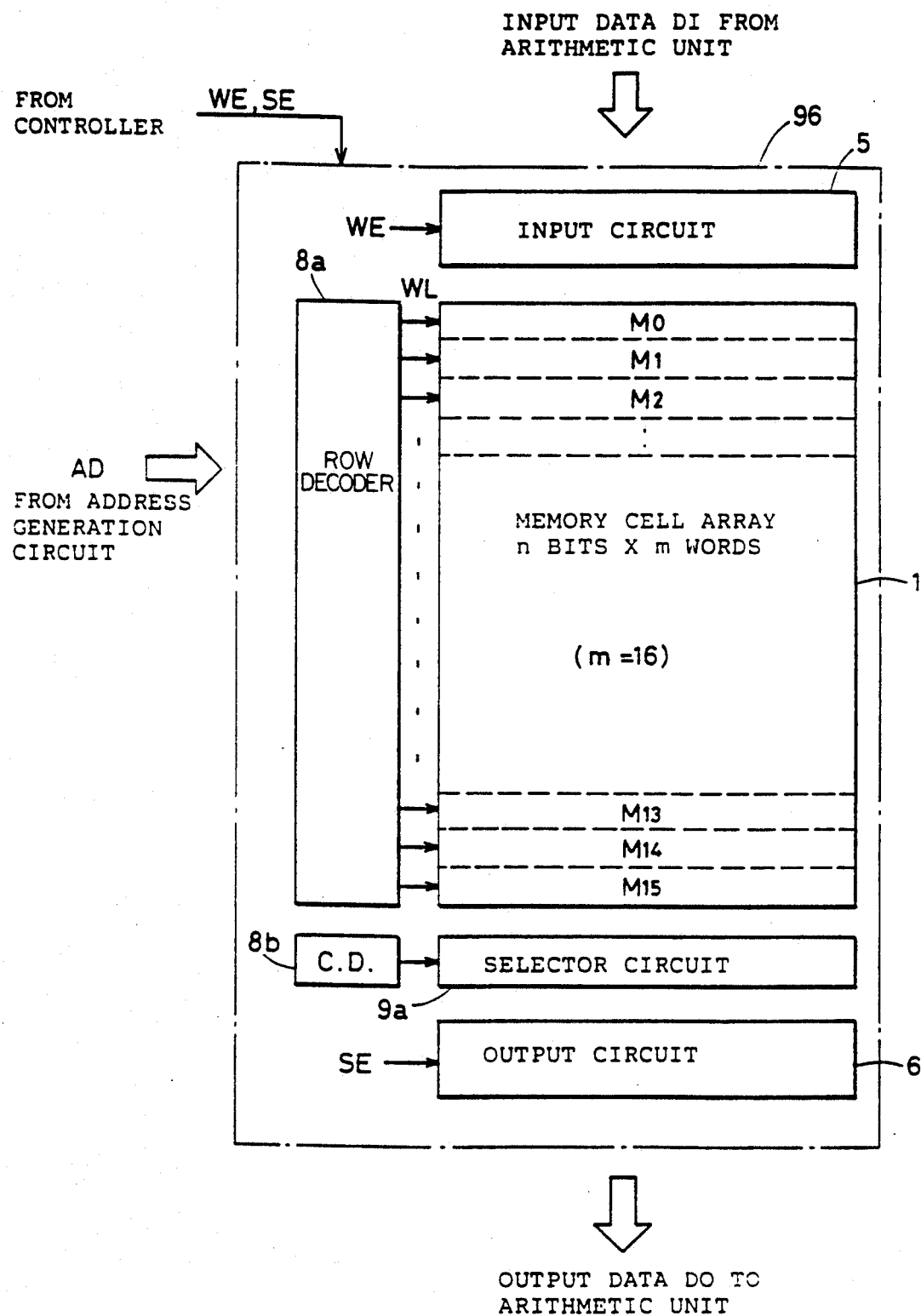
FIG. 10 is a circuit block diagram showing another example of a conventional SRAM provided in a microprocessor.

Accordingly, the following equation can be obtained as a general rule represented by a general expression shown in FIG. 5B:

$$r = p \cdot k1 + q \cdot k2 \quad (3).$$

The methodical operation indicated by the equation (3) is repeatedly carried out and, finally, data of the result can be obtained as X(0) to X(15). However, the sequence of the data, that is, the order of data on the frequency axis is not complete, so that conversion of the sequence of data is required.

A circuit similar to the circuit shown in FIG. 1 may be used for conversion of the sequence of data in the above-mentioned field of video processing. Referring to FIGS. 6A to 6C, the principle of the arrangement conversion processing in video processing will be described in the following. In the description below, it is assumed that picture elements constituting a screen SC are disposed in 4 rows and 4 columns in order to simplify the description. The screen SC is scanned in accordance with the sequence as shown in FIG. 6A.

Assuming that the picture displayed on the screen SC is represented by the picture data p0 to p15 shown in FIG. 6B, it is necessary to convert the picture element data to the sequence shown in FIG. 6C in order to turn this picture 90° in the counterclockwise direction. That is, the sequence of the original picture element data (p0, p1, p2, p3, p4, ... p15) is converted to a new sequence (p3, p7, p11, p15, p2, ... p12). In order to effect an arrangement conversion in video processing, a predetermined conversion of the sequence of picture element data is thus required.

FIG. 7 is a block diagram of the circuit for effecting the conversion of the picture element data shown in FIG. 6C. Referring to FIG. 7, either the circuit 2a or the circuit 2b shown in FIGS. 3 and 4 may be applied as the write designation circuit 2c. The write designation circuit 2c sequentially selects the memory cell rows M0 to M15 in write operation in response to the address signals A0 to A3 (not shown). Conversely, the read designation circuit 3b selects a memory cell row in the memory cell array 1 in accordance with the sequence of the address data represented in the circuit block SC shown in FIG. 6C. Accordingly, the picture element data stored in the memory cell array 1 is read in order of (p3, p7, p11, p15, p2, p12). That is, the change of the sequence of data for the arrangement conversion shown in FIG. 6C is effected.

Figure 11:
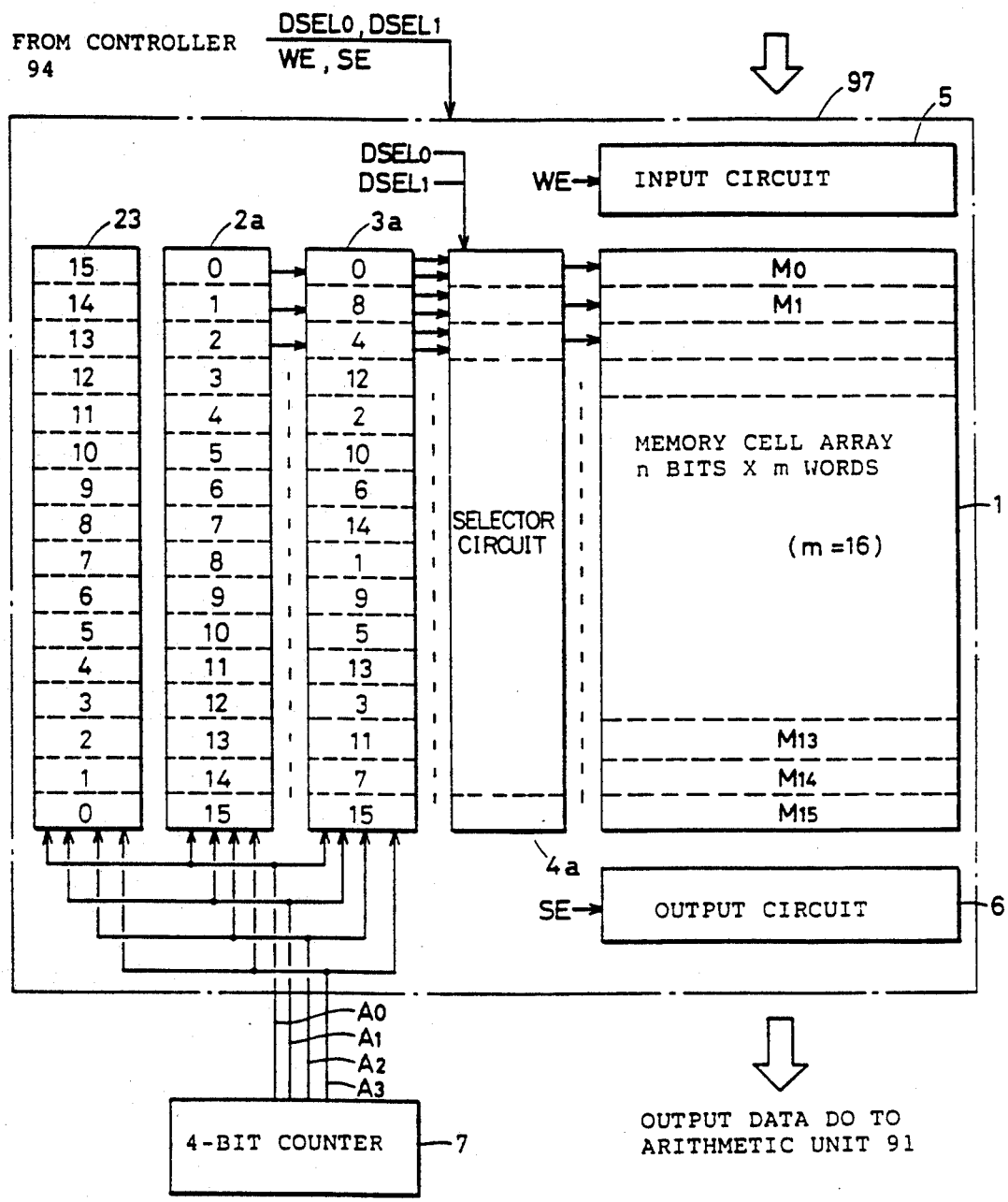
FIG. 11 is a circuit block diagram showing still another embodiment of the present invention.
Figure 12:
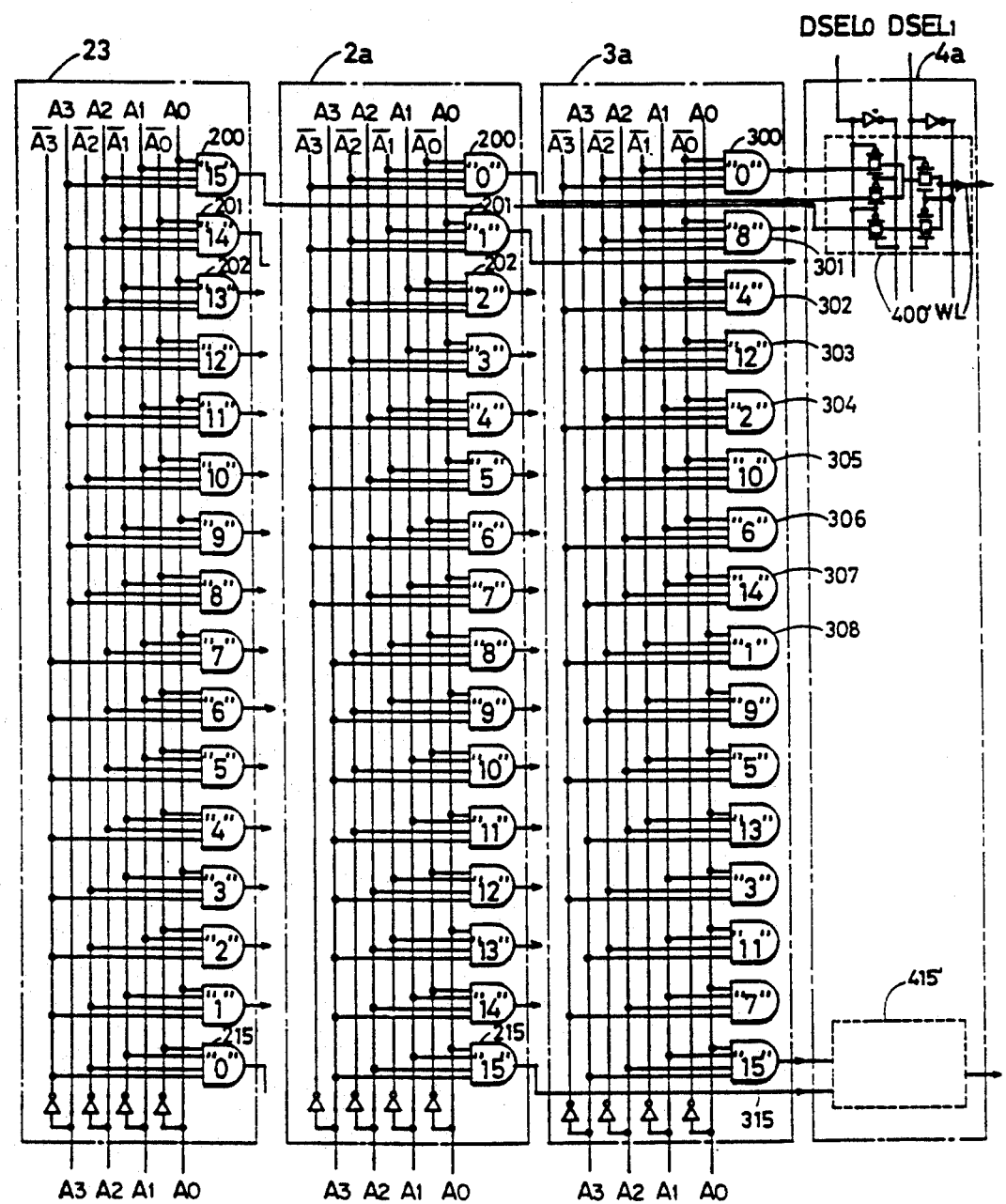
FIG. 12 is a circuit diagram of three designation circuits and a selector circuit shown in FIG. 11.

Referring to FIG. 11, SRAM 97 includes three designation circuits 2a, 3a and 23. Compared with SRAM 92 shown in FIG. 1, there is provided an additional designation circuit 23 for row designation an in reading or writing. It is pointed out that the present invention can be applicable to a semiconductor memory or a microprocessor having more than two designation circuits as shown in FIG. 11 while SRAM 92 shown in FIG. 1 included only two designation circuits 2a and 3a. FIG. 12 shows the detail of the three designation circuits 2a, 3a and 23 and a selector circuit 4a.

Referring to FIG. 12, each switching circuit, for example, 400' provided in selector circuit 4a selectively supplies one of three corresponding designation signals supplied from the three designation circuits 2a, 3a and 23, respectively, to word line WL0 in response to two select signals DSEL0 and DESEL1 supplied from an improved controller 94. Each switching circuit includes five CMOS transmission gates as shown in FIG. 12.

Figure 13:
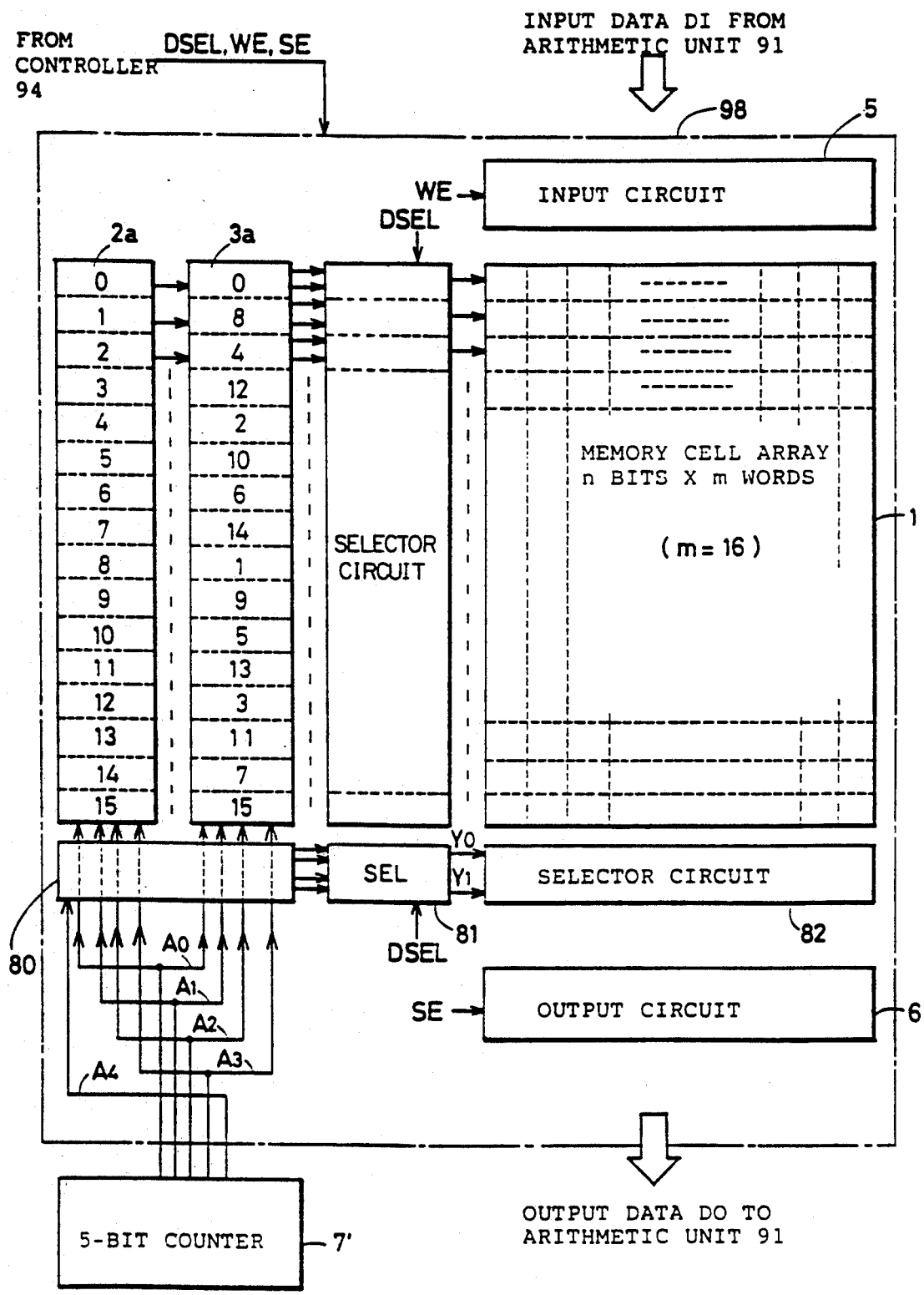
FIG. 13 is a circuit block diagram showing still another embodiment of the present invention.
Figure 14:
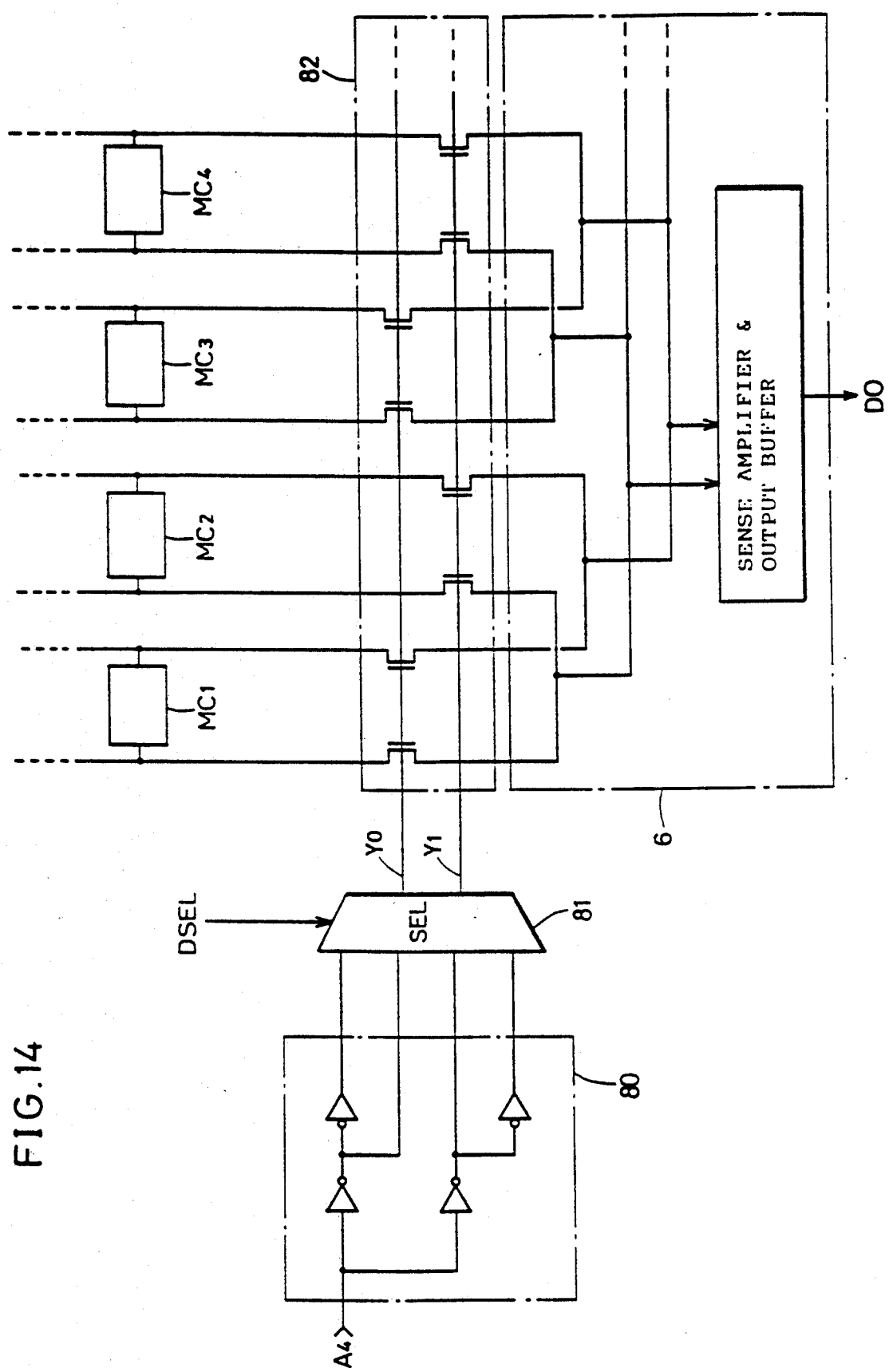
FIG. 14 is a circuit diagram of column selection circuits shown in FIG. 13.

Referring to FIG. 13, compared with SRAM 92 shown in FIG. 1, SRAM 98 further includes circuits for column selection. That is, SRAM 98 includes a one-bit decoder (column decoder) 80 for column selection, a selector (SEL) 81 which is operated in response to a select signal DSEL supplied from controller 94, and a selector circuits 82 responsive to column select signals Y0 and Y1 supplied from selector 81 for selecting either of columns of odd-numbered order or even-numbered order to be accessed. Column decoder 80 receives and decodes the most significant bit A4 among address signals A0 to A4 of 5 bits generated from a 5-bit counter 7. Other address signals A0 to A3 are supplied to designation circuits 2a and 3a in the same way as in the case of FIG. 1. FIG. 14 shows the column selection circuits and output circuit 6 shown in FIG. 13. It is noted that while column decoder 80 shown in FIG. 13 and 14 includes the one-bit decoder, a column decoder capable of decoding address signals including two or more bits may be applied as required. In such a case as well, such a column decoder decodes sequentially increasing (or changing) address signal and sequentially selects a column to be accessed.

As described above, it is possible to readily designate a memory cell row necessary for change of the sequence of data required in FFT without depending on the operation by the CPU, by providing the SRAM 92 shown in FIG. 1 in the microprocessor. The write designation circuit 2a and the read designation circuit 3a shown in FIG. 1 may designate a memory cell row required in FFT in response to sequentially increasing address signals A0 to A3. In other words, it is not necessary to provide an address signal changing in a complicated manner in order to effect bit reverse addressing, so that the CPU need not generate such a complicated address signal. That is, the operation by the CPU is not required in order to generate an address signal. This contributes in reducing the amount of the operation by the CPU. Therefore, the high speed of the CPU is insured. In a field such as FFT or video processing, and so on, the high-speed operation by the CPU is required. It is, therefore, noted that it is highly preferable that the operation to be processed by the CPU is decreased by the application of the SRAM 92 shown in FIG. 1.

While the conversion of the sequence of data in the fields of FFT and video processing has been described in the above-mentioned embodiment, it is noted that, generally, the present invention may be widely applied in a field of data processing in which a conversion of the sequence of data is required.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
    an array of memory cells arranged in a matrix of rows and columns and identified by row address and column address;
    address input means for successively generating addresses of said memory cells to be accessed;
    first designation means for designating a first sequence of accessing memory cells of said array in response to addresses generated by said address input means; and
    second designation means for designating a second sequence of accessing memory cells of said array in response to addresses generated by said address input means,
    said first sequence and said second sequence having a predetermined relationship.

2. A semiconductor memory device as recited in claim 1, further comprising:
    write means for writing data to said memory cells in a writing operation;
    read means for reading data stored in said memory cells in a reading operation; and
    sequence control means for selecting either one of said first and second designation means during said writing operation and either one of said first and second designation means during said reading operation, whereby the memory cell access sequence for writing may be different from the memory cell access for reading.

3. A semiconductor memory device as recited in claim 2, further comprising row activation means for activating a row of memory cells to be accessed; and
    wherein said address input means comprises counter means responsive to a pulsed clock signal for producing address signals which change with successive clock pulses;
    said first and second designation means each comprise a plurality of logic circuits, each logic circuit corresponding to a respective row of memory cells; and
    said sequence control means comprises switching means having inputs connected to said first and second designation means to receive outputs of said logic circuits, and outputs connected to said row activation means for accessing memory cells in a selected sequence.

4. A semiconductor memory device as recited in claim 2, wherein said array of memory cells comprises a static random access memory and said memory device further comprises row activation means for activating a selected row of memory cells of which a plurality of memory cells are simultaneously accessed; and wherein said first designation means comprises ring pointer means responsive to a clock signal;

said second designation means comprises a plurality of logic circuits, each logic circuit corresponding to a respective row of memory cells; and said sequence control means comprises switching means having inputs connected to said first and second designation means, and outputs connected to said row activation means for accessing memory cells in a selected sequence.

5. A semiconductor memory as recited in claim 1 wherein, said first designation means comprises first row designation means responsive to the addresses generated by said address input means for designating a first sequence of rows for accessing memory cells in said array, said second designation means comprises second row designation means responsive to the addresses generated by said address input means for designating a second sequence of rows for accessing memory cells in said array.

6. A semiconductor memory as recited in claim 5, wherein said first row designation means comprises sequential row selection means responsive to the addresses generated by said address input means for sequentially selecting a memory cell row in which data is to be written, within said memory cell array, and said second row designation means comprises controlled row selection means responsive to the addresses generated by said address input means for selecting a memory cell row from which data is to be read, within said memory cell array in accordance with said predetermined relationship.

7. A semiconductor memory as recited in claim 6, wherein said addresses generated by said address input means comprises a first plurality of address bits, said sequential row selection means comprises a first plurality of first logical product means connected to receive the first plurality of address bits in a first connection manner, said controlled row selection means comprises a second plurality of second logical product means connected to receive the first plurality of address bits in a second connection manner, and said first and second connection manner are determined in accordance with said predetermined relationship.

8. A semiconductor memory as recited in claim 6, wherein said address input means comprises a clock signal providing means for providing a clock signal as said addresses of said memory cells to be accessed, and said sequential row selection means comprises a ring pointer means responsive to said clock signal for sequentially designating a memory cell row in which data is to be written, within said memory cell array.

9. A semiconductor memory as recited in claim 1, wherein said predetermined relationship comprises a data arrangement conversion rule for Fast Fourier Transform (FFT).

10. A semiconductor memory as recited in claim 1, wherein said predetermined relationship comprises a scanning sequence conversion rule in image processing.

11. A semiconductor memory device, comprising:

an array of memory cells arranged in a matrix of rows and columns and identified by row address and column address;

address input means for successively generating addresses of said memory cells to be accessed;

first designation means for designating a first plurality of memory cell locations each to be accessed in said array in response to unique addresses generated by said address input means; and second designation means for designating a second plurality of memory cell locations of said array each to be accessed in response to said unique addresses;

said first and said second plurality of memory cell locations having a predetermined relationship.

12. A semiconductor memory device, comprising:

an array of memory cells arranged in an array of rows identifiable by row addresses;

address input means for successively generating addresses of said memory cells to be accessed;

write decoder means comprising a first plurality of logic circuits, each corresponding to a respective row of memory cells in accordance with a first unique set of addresses generated by said address input means;

read decoder means comprising a second plurality of logic circuits, each corresponding to a respective row of memory cells in accordance with a second unique set of addresses generated by said address input means; and selecting means for selecting either said write decoder for writing data to a corresponding memory cell row decoded by said write decoder or said read decoder for reading data from a corresponding memory cell row decoded by said read decoder.

13. A microprocessor, comprising:

operation processing means for executing an operation including a change of the sequence of data in accordance with a predetermined relationship;

an array of memory cells arranged in a matrix of row and columns and identified by row address and column address;

address input means for successively generating addresses of said memory cells to be accessed;

first designation means for designating a first sequence of accessing memory cells of said array in response to addresses generated by said address input means; and second designation means for designating a second sequence of accessing memory cells of said array in response to addresses generated by said address input means, said first sequence and said second sequence having said predetermined relationship.

14. A data sequence changing circuitry for changing the sequence of a plurality of data in accordance with a predetermined relationship, comprising:

an array of memory cells arranged in a matrix of row and columns and identified by row address and column address;

address input means for successively generating addresses of said memory cells to be accessed;

first designation means for designating a first sequence of accessing memory cells of said array in response to addresses generated by said address input means; and second designation means for designating a second sequence of accessing memory cells of said array in response to addresses generated by said address input means, said first sequence and said second sequence having said predetermined relationship.

15. A semiconductor memory device, comprising:

a memory cell array including a plurality of memory cell areas each having a plurality of memory cells;

a first decoder means having a plurality of write address decoders for enabling writing data, each write address decoder being arranged in a corresponding memory cell area and providing signal for activating said corresponding memory cell area in response to a writing address signal for designating said corresponding memory cell area;

a second decoder means having a plurality of read address decoders for reading data, each read decoder being arranged in a corresponding memory cell area and providing a signal for activating said corresponding memory cell area in response to a reading address signal for designating said corresponding memory cell area; and switching means for connecting said first decoder means to said corresponding memory cell area in the writing operation and connecting said second decoder means to said corresponding memory cell area in the reading operation, said writing address signal and reading address signal being different from each other according to a predetermined relationship.

* * * * *

UNITED STATES PATENT AND TRADEMARK OFFICE
CERTIFICATE OF CORRECTION

PATENT NO. : 5,253,213
DATED : October 12, 1993
INVENTOR(S) : Tetsuya MATSUMURA et al.

It is certified that error appears in the above-indentified patent and that said Letters Patent is hereby corrected as shown below:

On the title page, item [30] should read as follows:

--[30]  Foreign Application Priority Data
Oct. 9, 1990 [JP]   Japan . . . . . . . . . . . 2-271728--

Signed and Sealed this

Twenty-fourth Day of October, 1995

*Attest:*

BRUCE LEHMAN

*Attesting Officer*  *Commissioner of Patents and Trademarks*